(12) United States Patent
Aella et al.

(10) Patent No.: US 11,367,833 B2
(45) Date of Patent: Jun. 21, 2022

(54) MEMORY CELLS HAVING INCREASED STRUCTURAL STABILITY

(71) Applicant: Intel Corporation, Santa Clara, CA (US)

(72) Inventors: Pavan Kumar Reddy Aella, Eagle, ID (US); Kolya Yastrebenetsky, Boise, ID (US); Masuji Honjo, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 16/147,159

(22) Filed: Sep. 28, 2018

(65) Prior Publication Data

US 2019/0044061 A1    Feb. 7, 2019

(51) Int. Cl.
*H01L 45/00* (2006.01)
*G11C 13/00* (2006.01)
*H01L 27/24* (2006.01)

(52) U.S. Cl.
CPC .......... *H01L 45/06* (2013.01); *G11C 13/0004* (2013.01); *H01L 27/24* (2013.01); *H01L 45/1233* (2013.01); *H01L 45/1253* (2013.01); *H01L 45/141* (2013.01); *H01L 45/1666* (2013.01); *G11C 2213/52* (2013.01); *H01L 45/145* (2013.01); *H01L 45/148* (2013.01)

(58) Field of Classification Search
CPC .......................... H01L 45/06; H01L 45/1233
See application file for complete search history.

(56) References Cited

U.S. PATENT DOCUMENTS

| | | | | |
|---|---|---|---|---|
| 8,153,488 B2 * | 4/2012 | Nishitani | ............ | H01L 45/145 438/257 |
| 2006/0157683 A1 * | 7/2006 | Scheuerlein | ........ | H01L 27/2409 257/4 |
| 2007/0097739 A1 * | 5/2007 | Happ | .................. | H01L 45/1608 365/163 |
| 2008/0019170 A1 * | 1/2008 | Happ | .................. | H01L 45/1683 365/163 |
| 2010/0044664 A1 * | 2/2010 | Liu | ...................... | H01L 45/144 257/2 |
| 2013/0143380 A1 * | 6/2013 | Oh | ........................ | H01L 45/144 438/381 |
| 2015/0028280 A1 * | 1/2015 | Sciarrillo | ............ | H01L 27/2463 257/4 |
| 2016/0365512 A1 * | 12/2016 | Sung | ..................... | H01L 45/147 |
| 2019/0252607 A1 * | 8/2019 | Pirovano | ............. | H01L 27/2463 |

\* cited by examiner

*Primary Examiner* — Abul Kalam
(74) *Attorney, Agent, or Firm* — Alliance IP, LLC

(57) ABSTRACT

A memory cell can include a top lamina layer, a bottom lamina layer, and a phase change material (PCM) layer between the top lamina layer and the bottom lamina layer. The PCM layer can have a top surface in direct contact with the top lamina layer and a bottom surface in direct contact with the bottom lamina layer. The top surface of the PCM layer and the bottom surface of the PCM layer can have a structurally stabilizing width ratio.

10 Claims, 16 Drawing Sheets

MEMORY CELLS HAVING INCREASED STRUCTURAL STABILITY

BACKGROUND

Phase change materials have properties that invite their use in a number of applications, such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is designated a different binary value, and once stored, information can be read by detecting the electrical resistance of the material. The fact that each state persists once fixed makes PCM a valuable non-volatile memory (NVM) type.

DESCRIPTION OF EMBODIMENTS

Figure 1A:
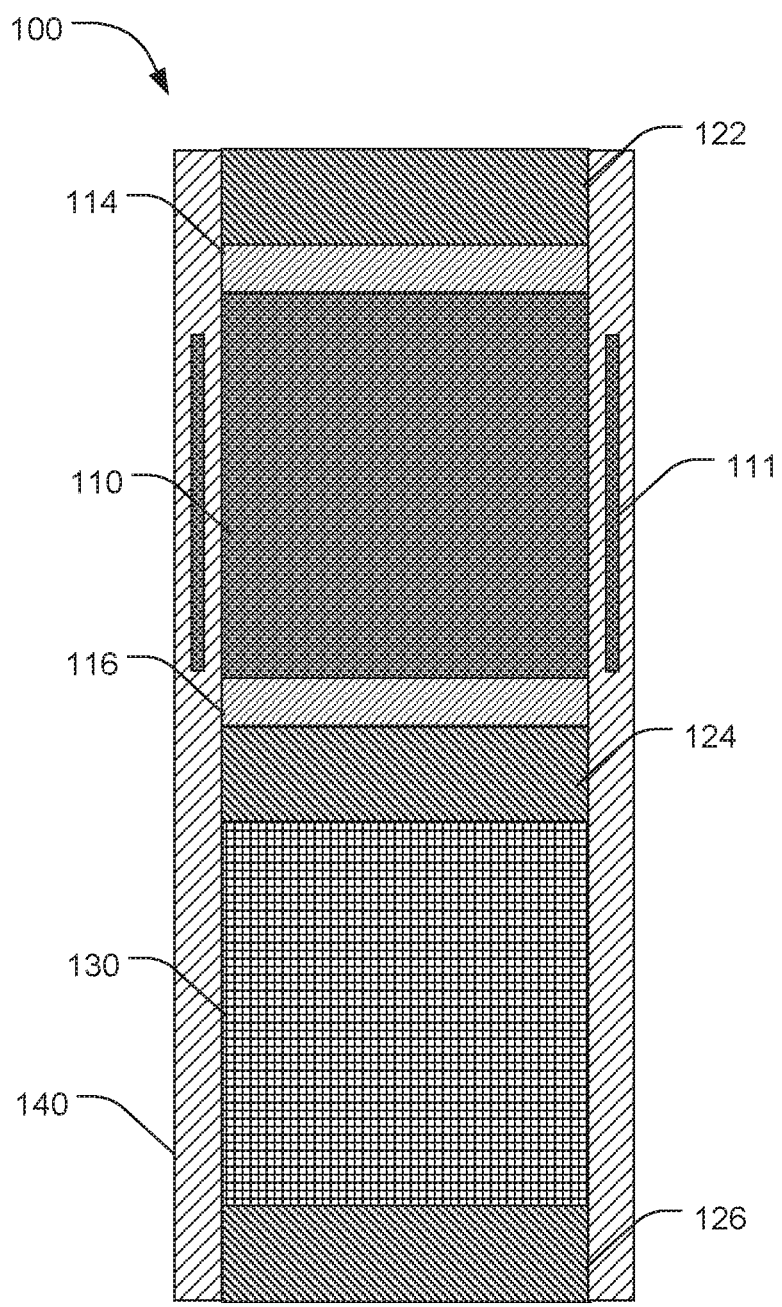
FIG. 1A illustrates a memory cell, in accordance with an example embodiment.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents (and vice versa) unless the context clearly dictates otherwise. Thus, for example, reference to "a memory cell" includes a plurality of such memory cells, and reference to "the bit lines" includes a single bit line.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

The term "coupled," as used herein, is defined as directly or indirectly connected in an electrical or nonelectrical manner. "Directly coupled" structures or elements are in direct physical contact with each other and are attached. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

Memory cells and devices are typically manufactured using a variety of deposition, patterning, and removal processes to achieve a desired configuration and structure for the memory cell or device. For example, a variety of materials having particular functional properties (e.g. conductive, semi-conductive, or insulative) are layered, oriented, and patterned to achieve a desired functional configuration. However, in some cases, removal of one or more materials can require a more aggressive removal process than for one or more adjacent materials. Where this is the case, unwanted removal of adjacent materials can occur. This can cause both functional and structural degradation of the final device. For examples, in some cases, excessive removal of adjacent layers can result in unwanted "toppling" (e.g. collapse) of a particular feature (e.g. a memory cell).

The present disclosure describes memory cells, devices, systems, and methods having or achieving improved structural stability and/or performance properties. In further detail, a memory cell can include a top lamina layer, a bottom lamina layer, and a memory material (e.g. a phase change material or (PCM)) layer between the top lamina layer and the bottom lamina layer. The memory material layer can have a top surface in direct contact with the top lamina layer and a bottom surface in direct contact with the bottom lamina layer. The width of the top surface of the PCM layer and the width of the bottom surface of the PCM layer can be very similar, or, in some cases, approximately, or substantially equivalent.

Turning now to the figures, FIG. 1A illustrates one example of a memory cell 100. The memory cell 100 includes a top lamina layer 114, a bottom lamina layer 116, and a PCM layer 110. A top surface of the PCM layer 110 interfaces with a bottom surface of the top lamina layer 114. A bottom surface of the PCM layer 110 interfaces with a top surface of the bottom lamina layer 116.

In further detail, the PCM layer can include one or more of a variety of materials. As a general matter, the phase change material can include any useful material having a stable and detectable change in phase (e.g. crystalline structure) or other properties. In some examples, the phase change material can include germanium, antimony, tellurium, silicon, nickel, gallium, arsenic, silver, tin, gold, lead, bismuth, indium, yttrium, selenium, scandium, boron, oxygen, sulphur, nitrogen, carbon, the like, or a combination thereof. Specific examples of such a materials can include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_Y Te_Z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient. In some additional examples, the chalcogenide alloy can be doped, such as with indium, yttrium, scandium, boron, nitrogen, oxygen, the like, or a combination thereof. In some specific examples, the phase change material can include antimony and tellurium. Where this is the case, antimony and tellurium can typically be present at a weight ratio (Sb/Te) of from 0.45 to 0.8. In other examples, antimony and tellurium can be present at a weight ratio of from 0.5 to 0.7. In still other examples, antimony and tellurium can be present at a weight ratio of from 0.55 to 0.65.

As described above, the top 114 and bottom 116 lamina layers can be positioned in direct contact with the PCM layer 110. These lamina layers can be adhesion layers or can otherwise facilitate a good electrical connection between the PCM layer 110 and surrounding electrode layers (e.g 122, 124). The lamina layers can be formed of a variety of materials. Non-limiting examples can include tungsten, tantalum, titanium, other refractory metals, refractory metal nitrides, refractory metal silicides, refractory metal carbides, refractory metal borides, the like, or a combination thereof.

In some additional examples, the memory cell 100 can also include a select device (SD) layer 130 including a select device material. It is noted that the select device material is generally made of a chalcogenide material, and as such, the materials described herein with respect to the PCM layer 110 are applicable here as well. The actual material used in a given memory structure for the PCM layer 110 and the SD layer 130 can be different or the same, depending on the design of the memory cell. In another example, the select device material in the SD layer 130 can be or include a conductor, semiconductor, or dielectric material. Such materials can be selected as needed to perform an intended function in the memory cell.

In some examples, one or more lamina layers (not shown) can be positioned in direct contact with the SD layer 130. For example, a first lamina layer can be positioned between the SD layer 130 and the PCM layer 110. In some additional examples, a second lamina layer can be positioned between the SD layer 130 and a third electrode 126. These lamina layers can be adhesion layers or can otherwise facilitate a good electrical connection between the SD layer and surrounding electrode layers (e.g. 124, 126). The lamina layers can be formed of a variety of materials. Non-limiting examples can include tungsten, tantalum, titanium, other refractory metals, refractory metal nitrides, refractory metal silicides, refractory metal carbides, refractory metal borides, the like, or a combination thereof.

The memory cells can also include one or more electrodes (e.g. first electrode 122, second electrode 124, third electrode 126, etc.). The electrode can include one or more conductive or semiconductive materials. Non-limiting examples can include carbon (C) (e.g. crystalline carbon, amorphous carbon), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof. In some examples, each electrode in the memory cell can include or be formed of the same materials. In other examples, one or more electrodes can include or be formed of different materials. The electrode can typically have a thickness of from about 5 nm to about 100 nm.

As described above, the similarity in widths between the top surface and the bottom surface of the memory material (e.g. PCM) layer can help maximize the structural stability of the memory cell. However, there are a number of other width ratios that can also help maximize the structural stability of the memory cell. This can be illustrated more clearly in FIG. 1B.

Figure 1B:
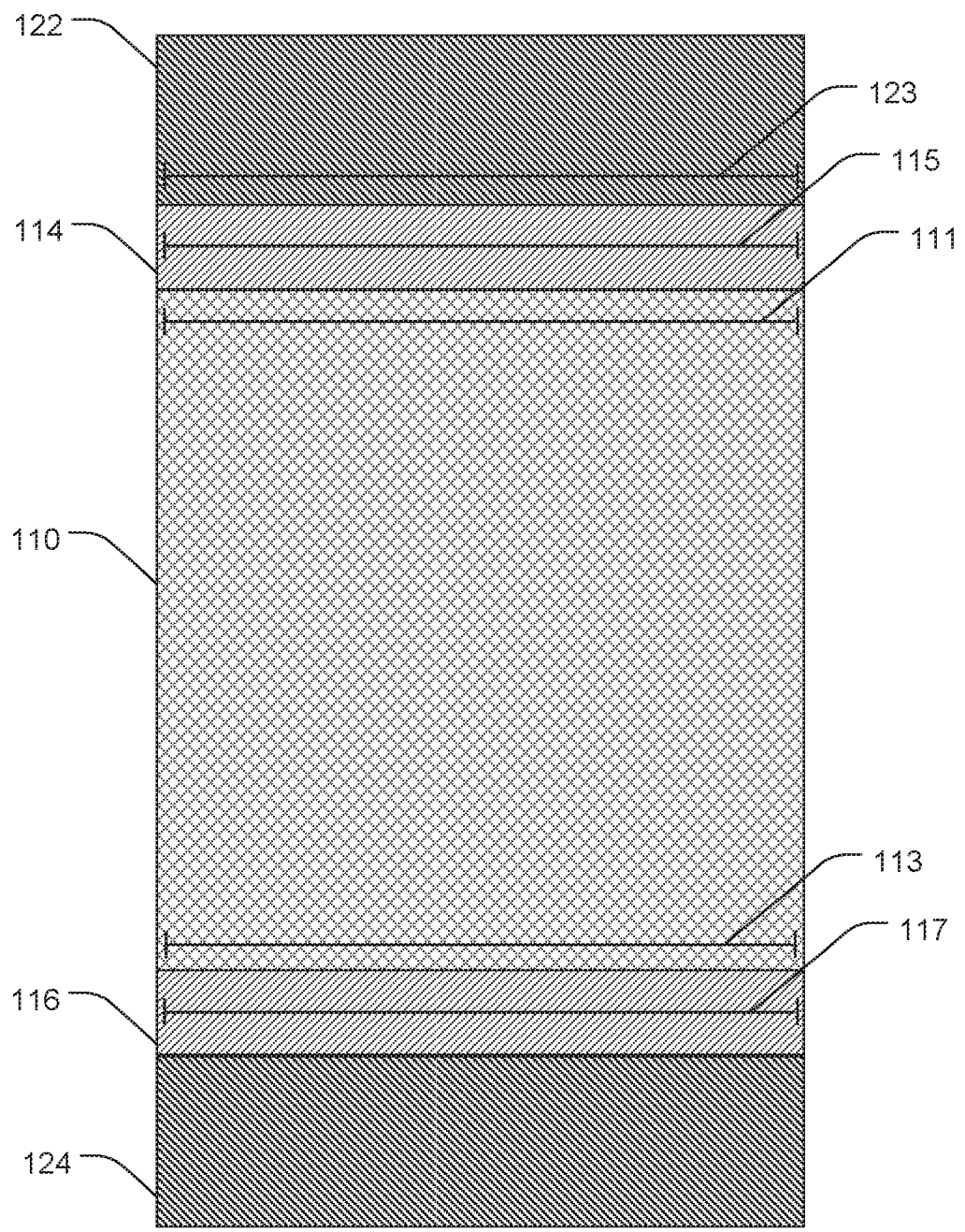
FIG. 1B illustrates a close up view of a portion of a memory cell, in accordance with an example embodiment.

FIG. 1B illustrates a portion of memory cell 100 presented in FIG. 1A. A top lamina layer 114 is in direct contact with a top surface of the PCM layer 110 and a bottom lamina layer 116 is in direct contact with the bottom surface of the PCM layer 110. The top surface of the PCM layer 110 has a width 111 and the bottom surface of the PCM layer has a width 113. The top lamina layer has a width 115 and the bottom lamina layer has a width 117. It is noted that the top lamina layer 114 and the bottom lamina layer 116 can often comprise a material that requires a more aggressive removal process than the PCM layer 110 when patterning individual memory cells. This can result in excessive removal of phase change material from the PCM layer 110, which can structurally destabilize the memory cell and degrade electrical performance of the memory cell. Thus, it can be desirable for the top and bottom surfaces of the PCM layer 110 to have similar widths to maximize structural stability and maintain desired electrical performance.

Thus, in some examples, the top surface of the PCM layer 110 and the bottom surface of the PCM layer 110 can have a width ratio of from about 0.8:1 to about 1.05:1 (top surface 111: bottom surface 113). In other examples, the top surface of the PCM layer and the bottom surface of the PCM layer can have a width ratio of from about 0.85:1 to about 1.02:1. In still additional examples, the top surface of the PCM layer and the bottom surface of the PCM layer can have a width ratio of from about 0.87:1 to about 1:1. In still further examples, the top surface of the PCM layer and the bottom surface of the PCM layer can have a width ratio of from about 0.9:1 to about 0.98:1 or about 0.99:1. In some examples, the width of the top surface of the PCM layer and the width of the bottom surface of the PCM layer can be substantially equivalent (e.g. within about 5% or about 6%).

In some further examples, it can also be desirable for the top surface of the PCM layer 110 to have a similar width as the top lamina layer 114. This can further maximize the structural stability of the memory cell. Thus, in some examples, the top surface of the PCM layer and the top lamina layer can have a width ratio of from 0.7:1 to 1.05:1 (top surface of PCM 111: top lamina layer 115). In some other examples, the top surface of the PCM layer and the top lamina layer can have a width ratio of from 0.75:1 to 1.02:1. In additional examples, the top surface of the PCM layer and the top lamina layer can have a width ratio of from 0.8:1 to 1:1. In still additional examples, the top surface of the PCM layer and the top lamina layer can have a width ratio of from 0.82:1 to 0.98:1. In still further examples, the top surface of the PCM layer and the top lamina layer can have a width ratio of from 0.85:1 to 0.95:1.

It can also be desirable for the top lamina layer 114 to have a similar width as a bottom surface of a first electrode 122 to increase the stability of the memory cell. Thus, in some examples, the top lamina layer and the bottom surface (interfacing with the top lamina layer) of the first electrode can have a width ratio of from 1.4:1 to 1.05:1 (top lamina layer 115: bottom surface of first electrode 123). In some other examples, the top lamina layer and the bottom surface of the first electrode can have a width ratio of from 1.3:1 to 1:1. In additional examples, the top lamina layer and the bottom surface of the first electrode can have a width ratio of from 1.2:1 to 0.8:1. In still additional examples, the top lamina layer and the bottom surface of the first electrode can have a width ratio of from 1.1:1 to 0.9:1. In still further examples, the top lamina layer and the bottom surface of the first electrode can have a width ratio of from 1.15:1 to 0.85:1.

In some additional examples, it can also be desirable for the bottom surface of the PCM layer 110 to have a similar width as the bottom lamina layer 116. This can also further maximize the structural stability of the memory cell. Thus, in some examples, the bottom surface of the PCM layer and the bottom lamina layer can have a width ratio of from 0.6:1 to 1.05:1 (bottom surface of PCM 113: bottom lamina layer 117). In some other examples, the bottom surface of the PCM layer and the bottom lamina layer can have a width ratio of from 0.63:1 to 1:1. In additional examples, the bottom surface of the PCM layer and the bottom lamina layer can have a width ratio of from 0.65:1 to 0.95:1. In still additional examples, the bottom surface of the PCM layer and the bottom lamina layer can have a width ratio of from 0.68:1 to 0.9:1. In still further examples, the bottom surface of the PCM layer and the bottom lamina layer can have a width ratio of from 0.7:1 to 0.85:1.

Figure 1C:
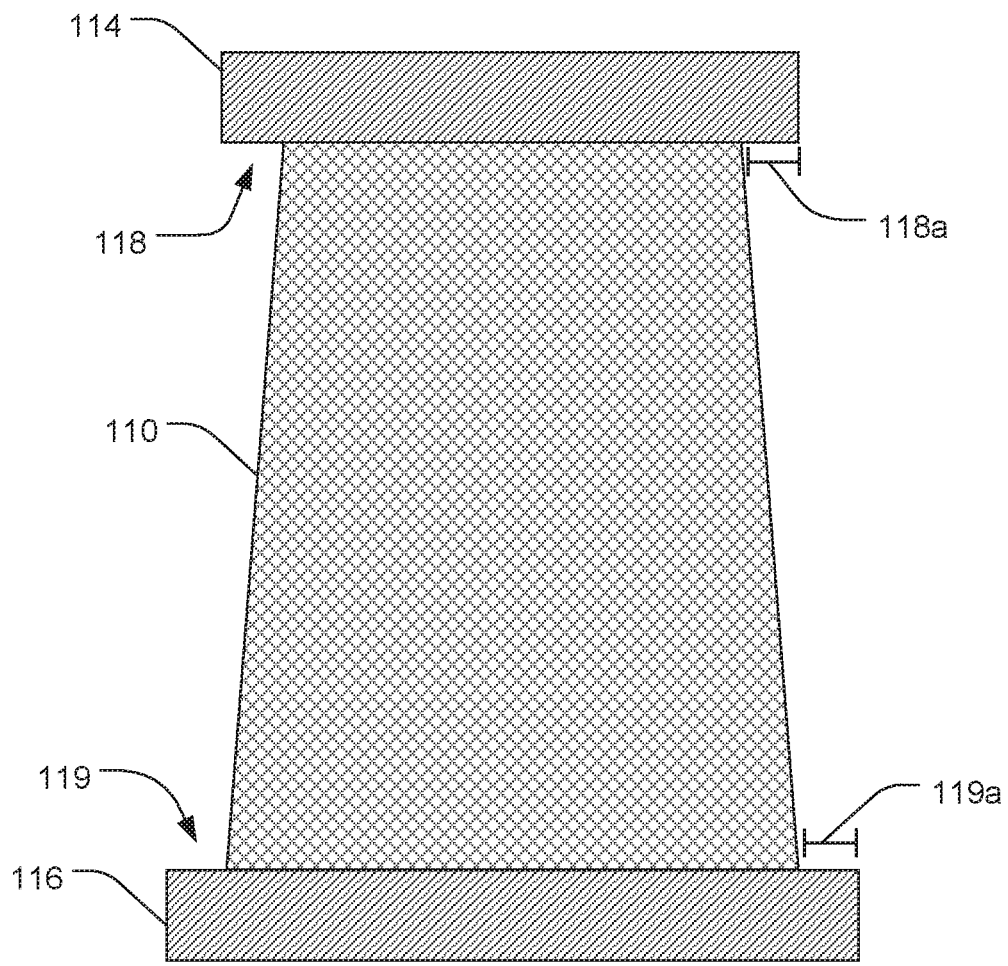
FIG. 1C illustrates a close up view of a portion of a memory cell, in accordance with an example embodiment.

FIG. 1C illustrates a close up view of on example of a structural relationship between the top lamina layer 114, the bottom lamina layer 116, and the PCM layer 110. As will be recognized from the width ratios listed above, the top lamina layer may not always have the same width as the bottom lamina layer or the PCM layer, or vice versa. Further, the top surface of the PCM layer may not always have the same width as the bottom surface of the PCM layer. Rather, in some examples, the PCM layer can have lateral edges that are not substantially parallel. In some examples, the PCM layer can have a trapezoidal, or substantially trapezoidal, cross-section. Further, in some examples, as illustrated in FIG. 1C, the bottom lamina layer 116 can be wider than the top lamina layer 114. Additionally, in some examples, the bottom surface of the PCM layer 110 can be wider than the top surface of the PCM layer 110. Further still, width discrepancies between one or more of the lamina layers 114, 116 and an interfacing surface of the PCM layer 110 can produce a recess from a lateral edge of the corresponding lamina layer to a lateral edge of the PCM layer. For example, where the top lamina layer 114 is wider than a top surface of the PCM layer 110, an upper recess 118 can be formed. The upper recess 118 can extend from a lateral edge of the top lamina layer 114 to a lateral edge of the PCM layer at the top surface to a depth or distance 118a. Typically, where an upper recess is present, the upper recess can have a depth of less than 5 nanometers (nm). In some specific examples, the upper recess can have a depth of from 0.01 nm to 5 nm, from 0.05 nm to 4 nm or 3 nm, or from 0.1 nm to 2 nm or 1 nm.

Similarly, where the bottom lamina layer 116 is wider than a bottom surface of the PCM layer 110, a lower recess 119 can be formed. The lower recess 119 can extend from a lateral edge of the bottom lamina layer 116 to a lateral edge of the PCM layer at the bottom surface to a depth or distance 119a. Typically, where a lower recess is present, the lower recess can have a depth of less than 10 nm or less than 5 nm. In some specific examples, the upper recess can have a depth of from 0.01 nm to 10 nm, from 0.05 nm to 5 nm, from 0.1 nm to 4 nm or 3 nm, or from 0.5 nm to 2.5 nm.

Turning again to FIG. 1A, in some examples, a memory cell 100 can include residual phase change material 111 within a dielectric material 140 positioned along a lateral edge of the top lamina layer 114, the bottom lamina layer 116, and/or the PCM layer 110. Generally, the residual phase change material is not in direct contact with the PCM layer 110. For example, the residual phase change material can be spaced laterally from the memory cell 100 a distance of from about 0.5 nm to about 2 nm. However, in some examples, the residual phase change material 111 may be in direct contact with one or more of the PCM layer 110, the top lamina layer 114, or a first electrode layer 122. In some examples, the dielectric material 140 can form, include, or be included in a protective liner along the lateral edge of the top lamina layer 114, the bottom lamina layer 116, and the PCM layer 110. In other examples, the dielectric material 140 can form part of a bulk insulating material deposited or formed along a lateral edge of the top lamina layer 114, the bottom lamina layer 116, and/or the PCM layer 110. In either case, residual phase change material 111 can be located within the dielectric material 140. The residual phase change material 111 can result from a manufacturing process as described herein to achieve improved structural stability for the memory cell, as will be described in greater detail below. In some specific examples, the residual phase change material can form a residual phase change layer extending along a lateral edge of the PCM layer 110, the top lamina layer 114, a first electrode layer 122, or a combination thereof.

Figure 2A:
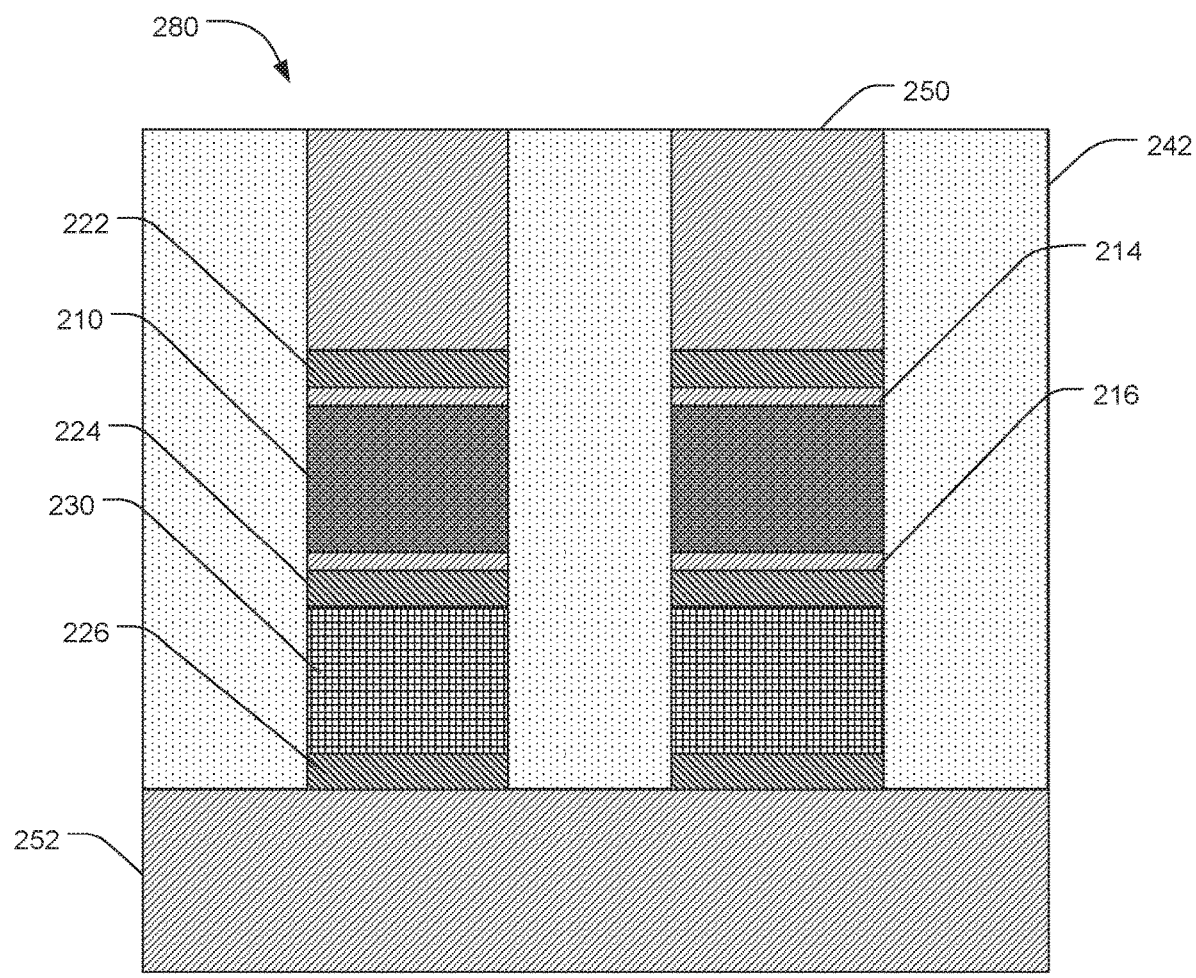
FIG. 2A illustrates a cross-sectional view of memory device along a lower conductive layer, in accordance with an example embodiment.
Figure 2B:
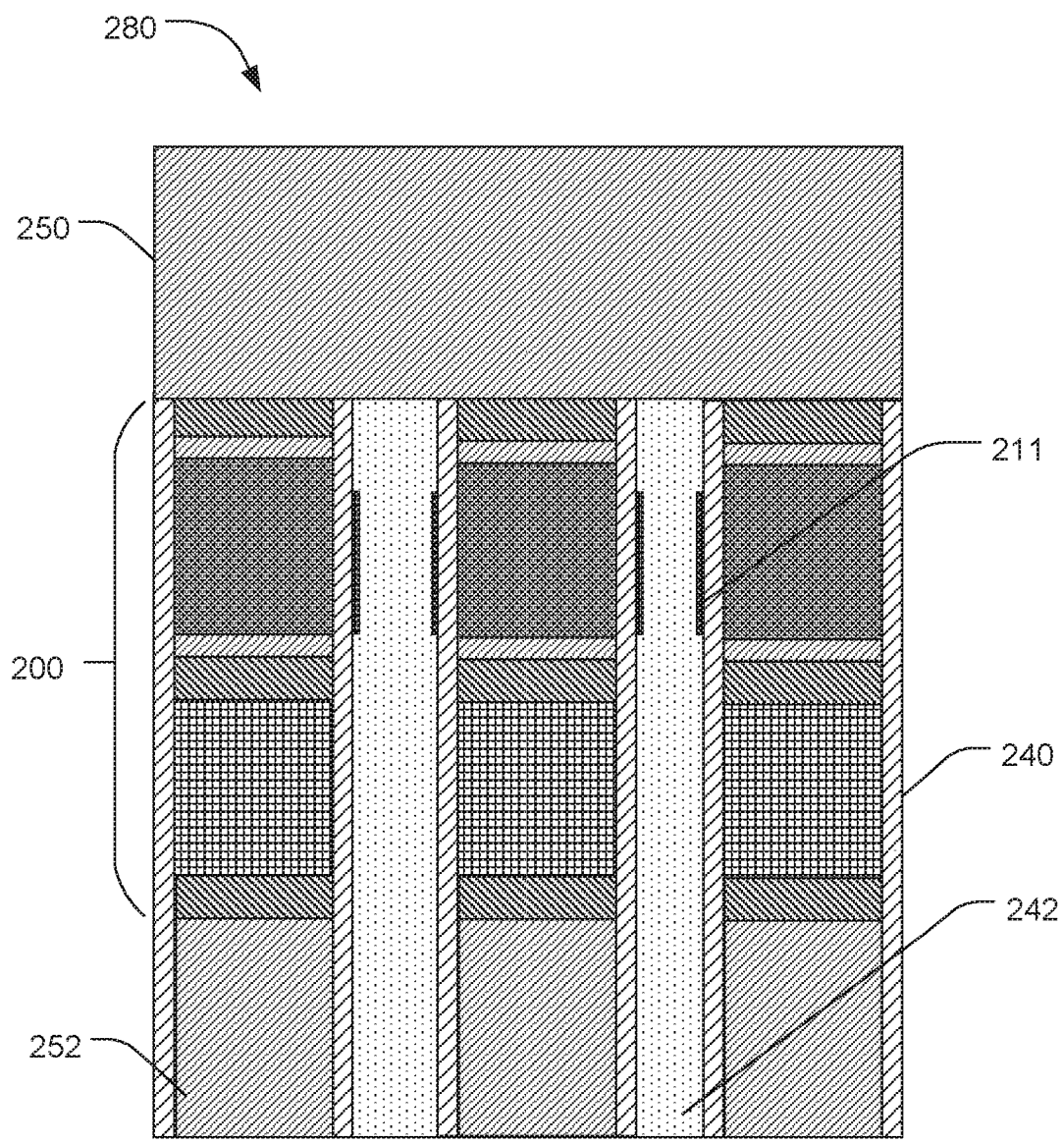
FIG. 2B illustrates a cross-sectional view of the memory device of FIG. 2A along an upper conductive layer, in accordance with an example embodiment.

As illustrated in FIGS. 2A and 2B, individual memory cells 200 (including a first electrode layer 222, a top lamina layer 214, a PCM layer 210, a bottom lamina layer 216, a second electrode layer 224, an SD layer 230, and a third electrode layer 226) can be positioned between upper conductive channels 250 and lower conductive channels 252 to form a memory device 280. The structural configuration of the upper conductive channels 250 and the lower conductive channels 252 relative to the individual memory cells 200 can allow individual memory cells 200 to be individually addressable. In some specific examples, individual memory cells 200 can be arranged in rows and columns with first conductive channels (e.g. conductive channels 250) oriented along rows of individual memory cells 200 and second conductive channels (e.g. conductive channels 252) oriented along individual columns of memory cells 200 to form a memory array having individually addressable memory cells. However, other configurations can also be used as desired.

The upper and lower conductive channels can be made of a variety of conductive materials. Non-limiting examples can include tungsten (W), copper (Cu), ruthenium (Ru), tungsten nitride (WN), nickel (Ni), aluminum (Al), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof. In some examples, the upper and lower conductive channels can comprise the same materials. In some examples, the upper conductive channels can comprise a different material than the lower conductive channels. In other examples, the lower conductive channels can comprise a different material than the upper conductive channels.

The memory device can also include one or more dielectric materials 242 positioned to insulate individual memory cells 200. In some examples, the dielectric material 242 can include a liner 240 lining a lateral edge of individual memory cells 200. Where this is the case, the liner 240 and the bulk dielectric material 242 can comprise the same or different dielectric material(s). In some examples, the dielectric material can include silicon oxide, silicon nitride, silicon oxy-carbide, spin-on-glass, organic polymer, organic/inorganic co-polymer, or other suitable dielectric material.

Figure 3:
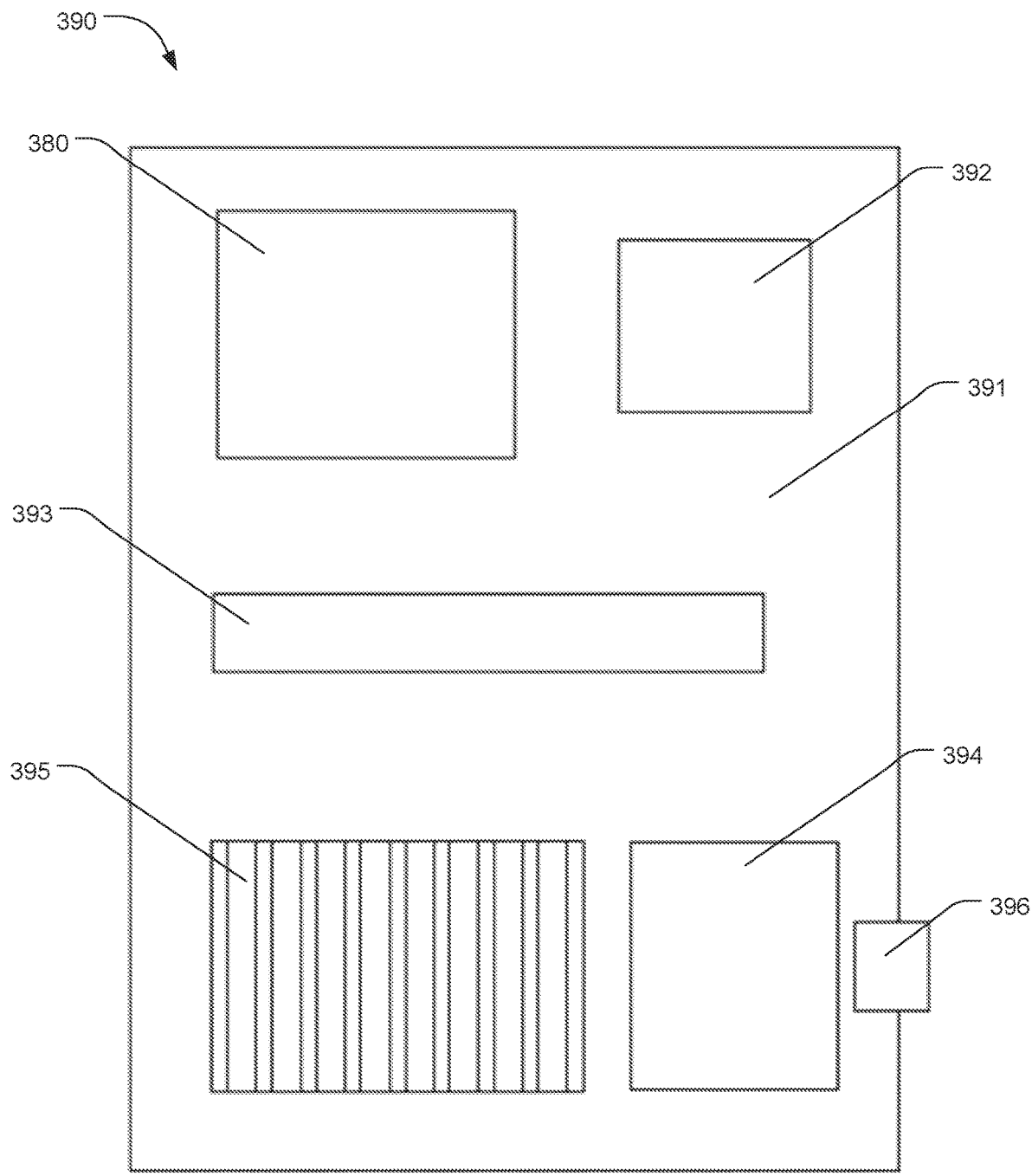
FIG. 3 illustrates a computing system, in accordance with an example embodiment.

In some examples, a memory device as described herein can be included in a computing system. As illustrated in FIG. 3, computing system 390 can include a motherboard 391 and a memory device 380, as described herein, that is operably coupled to the motherboard 391. In one aspect, a computing system 390 can also include a processor 392, an additional memory device 393, a radio 394, a heat sink 395, a port 396, a slot, or any other suitable device or component, which can be operably coupled to the motherboard 391. The computing system 390 can comprise any type of computing system, such as a desktop computer, a laptop computer, a tablet computer, a smartphone, a wearable device, a server (e.g. a local data storage server, a cloud storage server, or the like), etc. Other embodiments need not include all of the features specified in FIG. 3, and may include alternative features not specified in FIG. 3.

Circuitry used in electronic components or devices (e.g. a die) of a computing system can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object-oriented programming language to communicate with a computer system. However, the program(s) may be implemented in assembly or machine language, if desired. In any case, the language may be a compiled or interpreted language, and combined with hardware implementations.

Figure 4A:
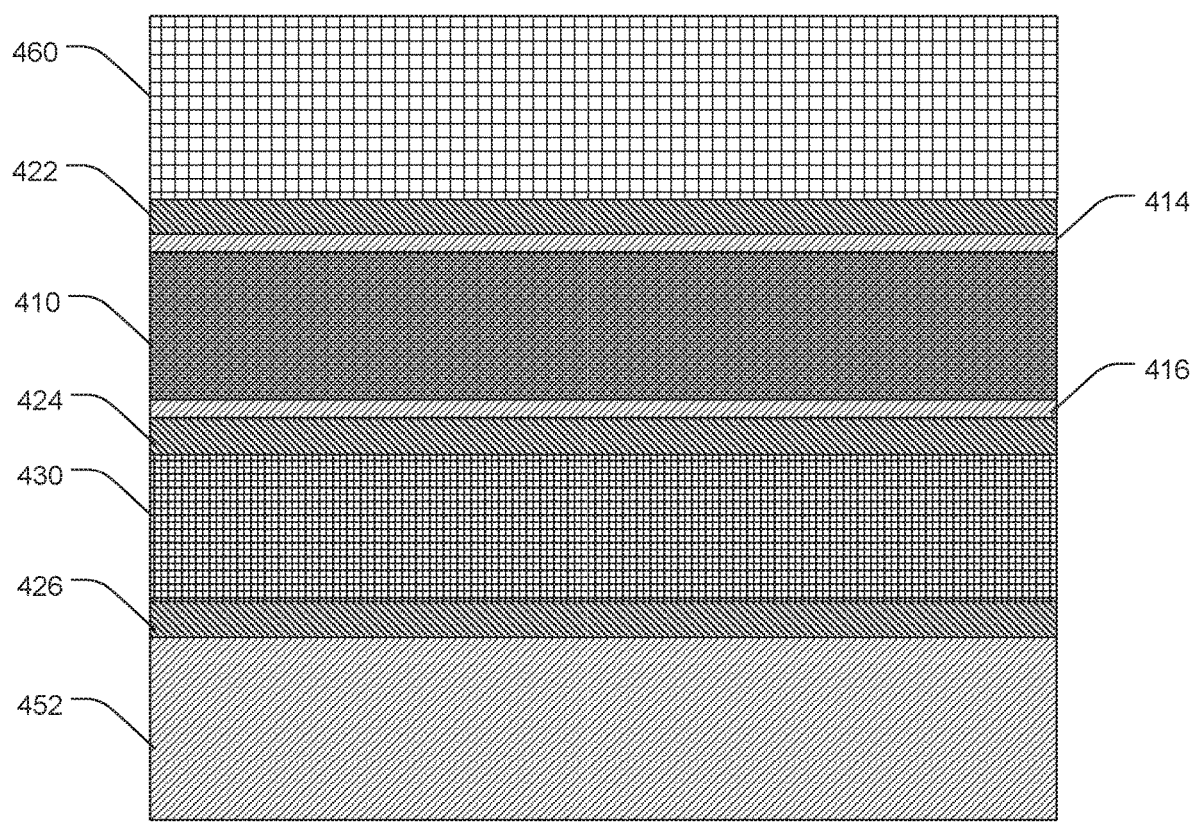
FIG. 4A illustrates a memory cell at one stage of manufacturing, in accordance with an example embodiment.

The present disclosure also describes methods of manufacturing a memory cell. For example, FIGS. 4A-4J illustrate various manufacturing steps that can be employed in manufacturing a memory cell. More specifically, FIG. 4A illustrates a stack of layers that can be prepared and used to manufacture one or more memory cells. Non-limiting examples of layers that can be included in the stack are a lower conductive channel layer 452, a third electrode layer 426, an SD layer 430, a second electrode layer 424, a bottom lamina layer 416, a PCM layer 410, a top lamina layer 414, a first electrode layer 422, and a mask layer 460.

Figure 4B:
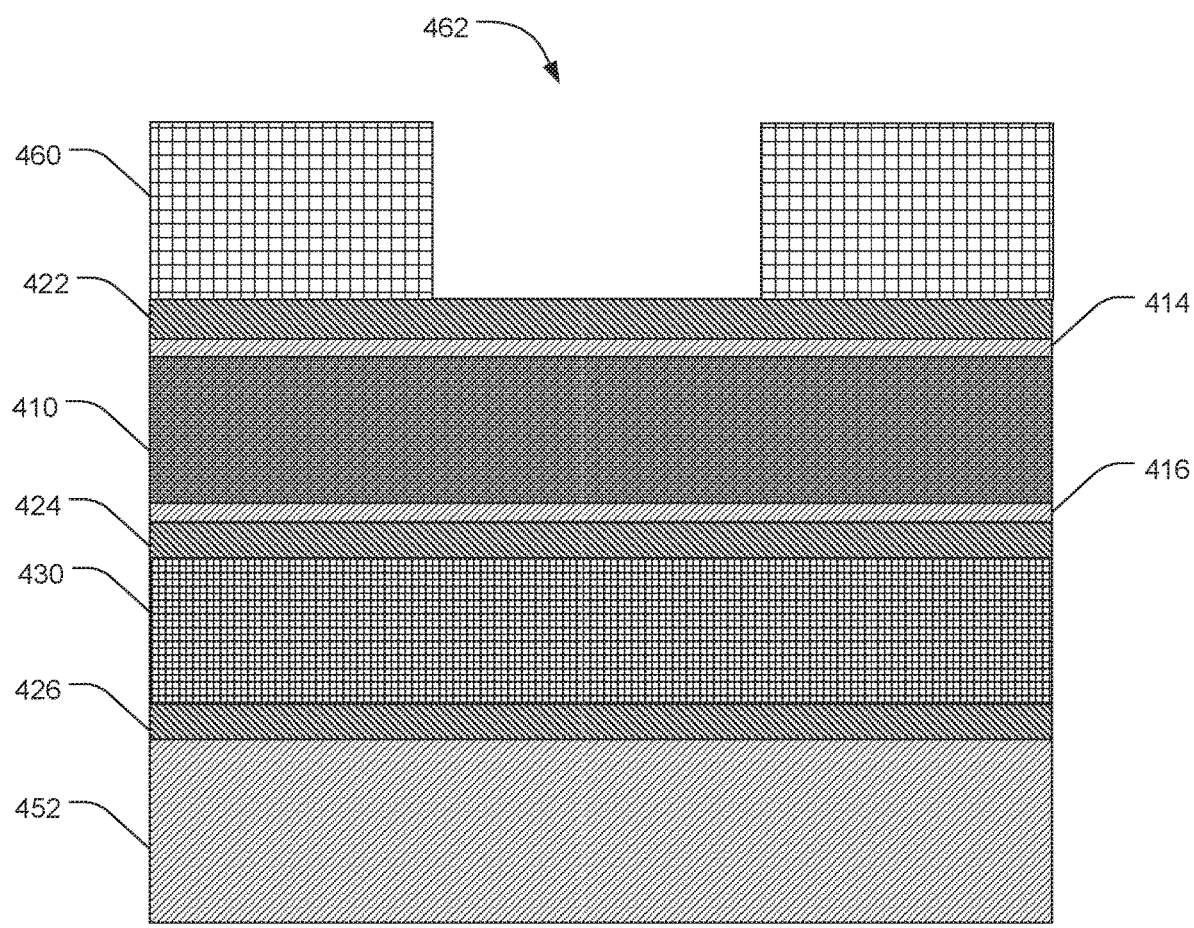
FIG. 4B illustrates a memory cell at one stage of manufacturing, in accordance with an example embodiment.

As illustrated in FIG. 4B, mask layer 460 can be patterned with one or more trenches 462 to define boundaries between individual memory cells. The trench 462 can be formed using dry etching, wet etching, other suitable removal process, or a combination thereof.

Figure 4C:
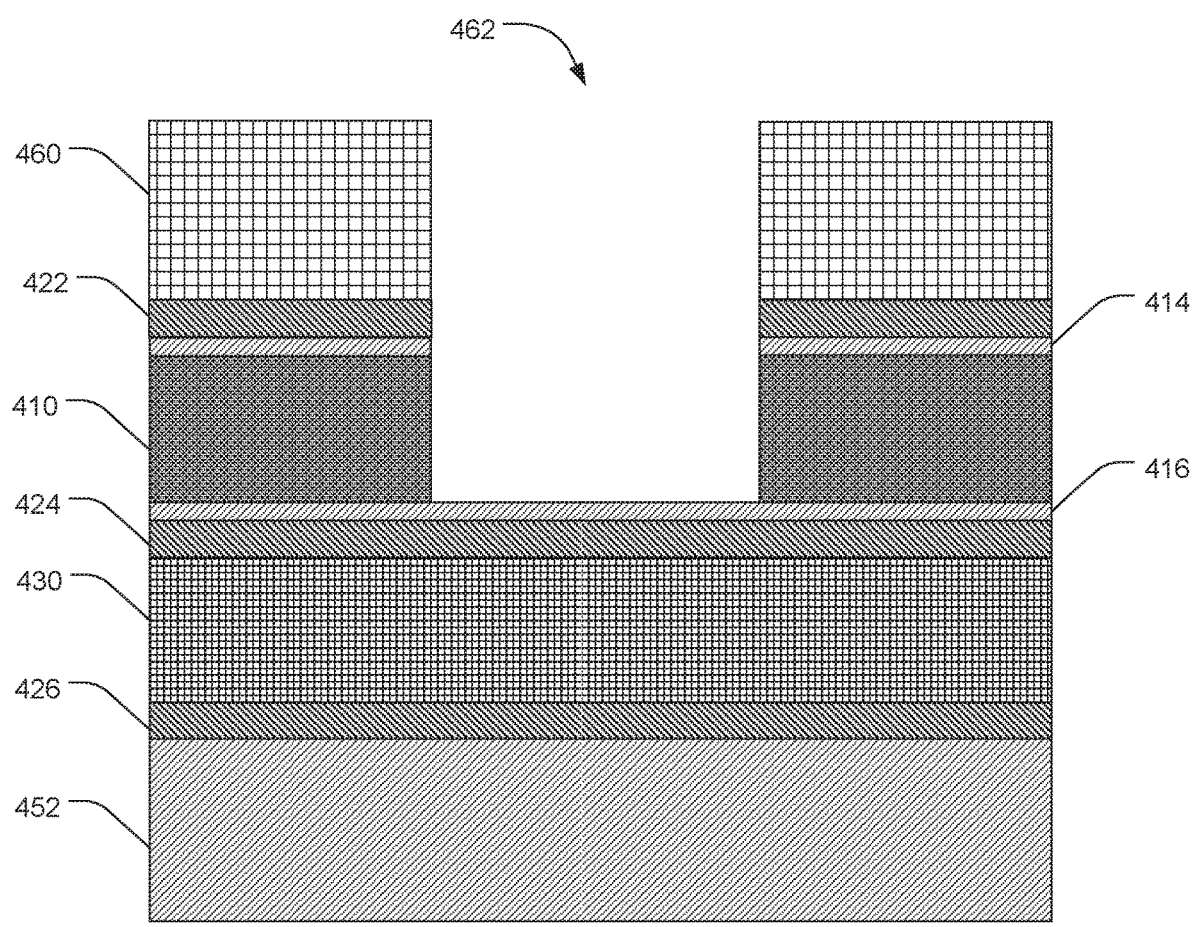
FIG. 4C illustrates a memory cell at one stage of manufacturing, in accordance with an example embodiment.

Turning to FIG. 4C, the trench 462 can be extended through the first electrode layer 422, the top lamina layer 414, and the PCM layer 410. Extending trench 462 down to the bottom lamina layer 416 can be performed with dry etching, wet etching, other suitable removal process, or a combination thereof. However, as described above, removal of lamina material can employ more aggressive removal techniques than otherwise necessary for removal of material from the PCM layer, for example. Thus, extending the trench 462 through the bottom lamina layer 416 can also remove excessive amounts of phase change material from the PCM layer 410.

Figure 4D:
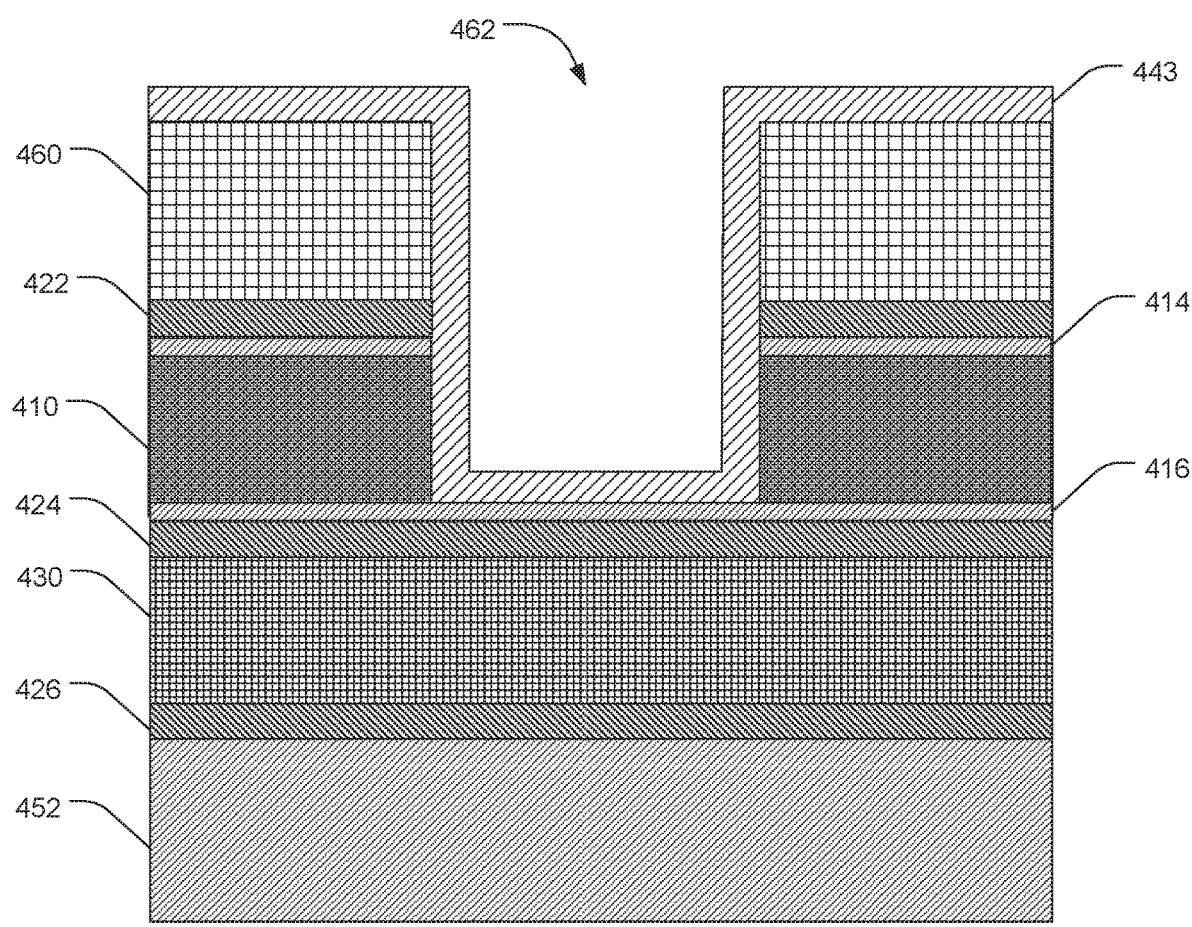
FIG. 4D illustrates a memory cell at one stage of manufacturing, in accordance with an example embodiment.

Accordingly, as illustrated in FIG. 4D, a first protective liner 443 can be formed along a perimeter of the trench 462 prior to extending the trench 462 through the bottom lamina layer 416. The first protective liner 443 can help protect the PCM layer 410, the first electrode layer 422, and the top lamina layer 414 from excessive material removal during removal of lamina material from the bottom lamina layer. Generally, any suitable dielectric material can be used for the first protective liner that is resistant to dry etching and/or wet etching and that has good conformability. In some specific examples, the first protective liner can be formed of a silicon oxide, a silicon nitride, a silicon oxynitride, other suitable protective material, or a combination thereof.

Figure 4E:
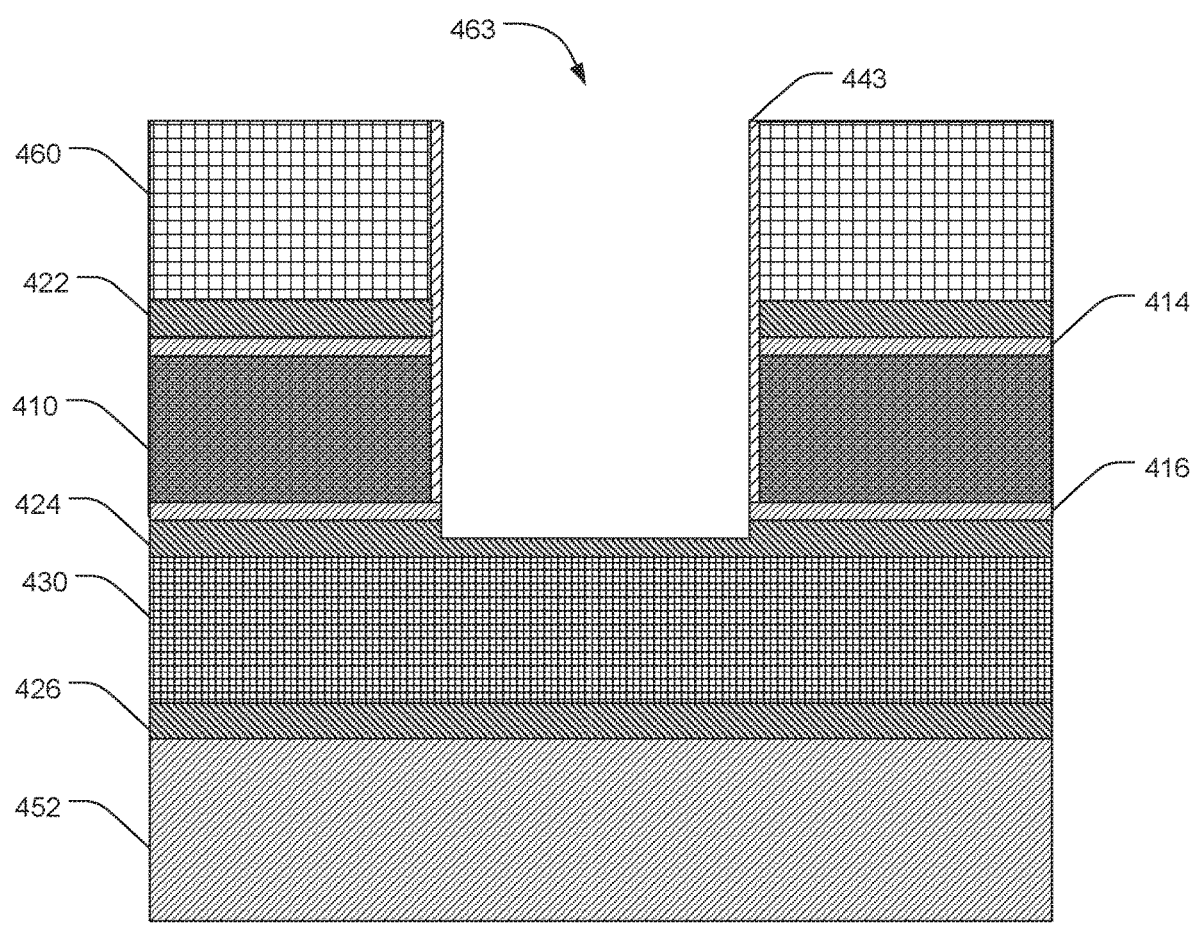
FIG. 4E illustrates a memory cell at one stage of manufacturing, in accordance with an example embodiment.

The first protective liner 443 can maximize structural stability of the memory cell while the trench 462 is extended through the bottom lamina layer 416. As illustrated in FIG. 4E, the first protective liner 443 can be largely removed during extension of the trench through the bottom lamina layer 416 and part of the second electrode layer 424. However, part of the first protective liner 443 can remain along a portion of the perimeter of the first extended trench 463.

Figure 4F:
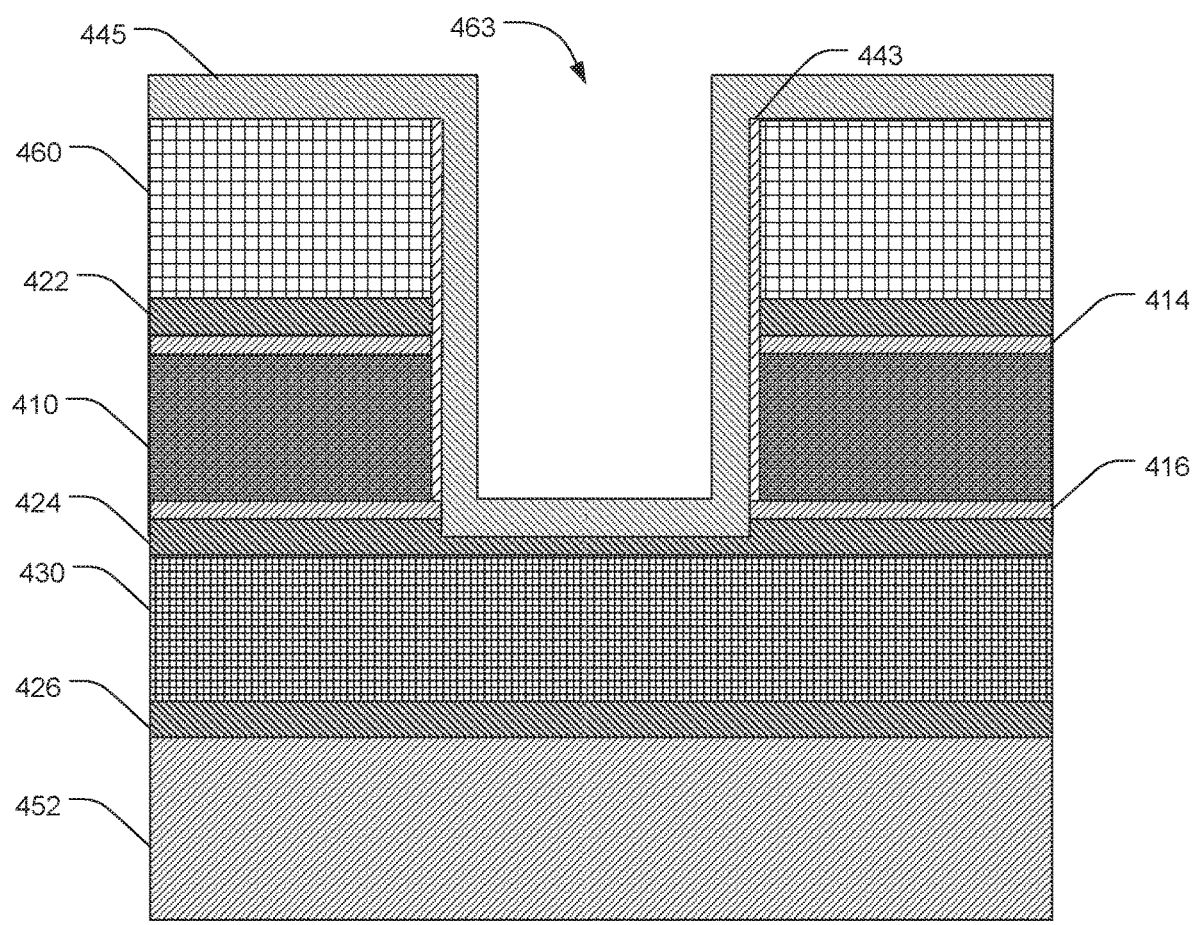
FIG. 4F illustrates a memory cell at one stage of manufacturing, in accordance with an example embodiment.

A second protective liner 445 can be formed along a perimeter of the first extended trench 463 prior to further extension of the first extended trench 463 (See FIG. 4F). The second protective liner 445 can help protect the PCM layer 410, the first electrode layer 422, the top lamina layer 414, and the bottom lamina layer 416 to excessive material removal during removal of subsequent layers. Generally, any suitable dielectric material can be used for the second protective liner that is resistant to dry etching and/or wet etching and that has good conformability. In some specific examples, the second protective liner can be formed of a silicon oxide, a silicon nitride, a silicon oxynitride, other suitable protective material, or a combination thereof.

Figure 4G:
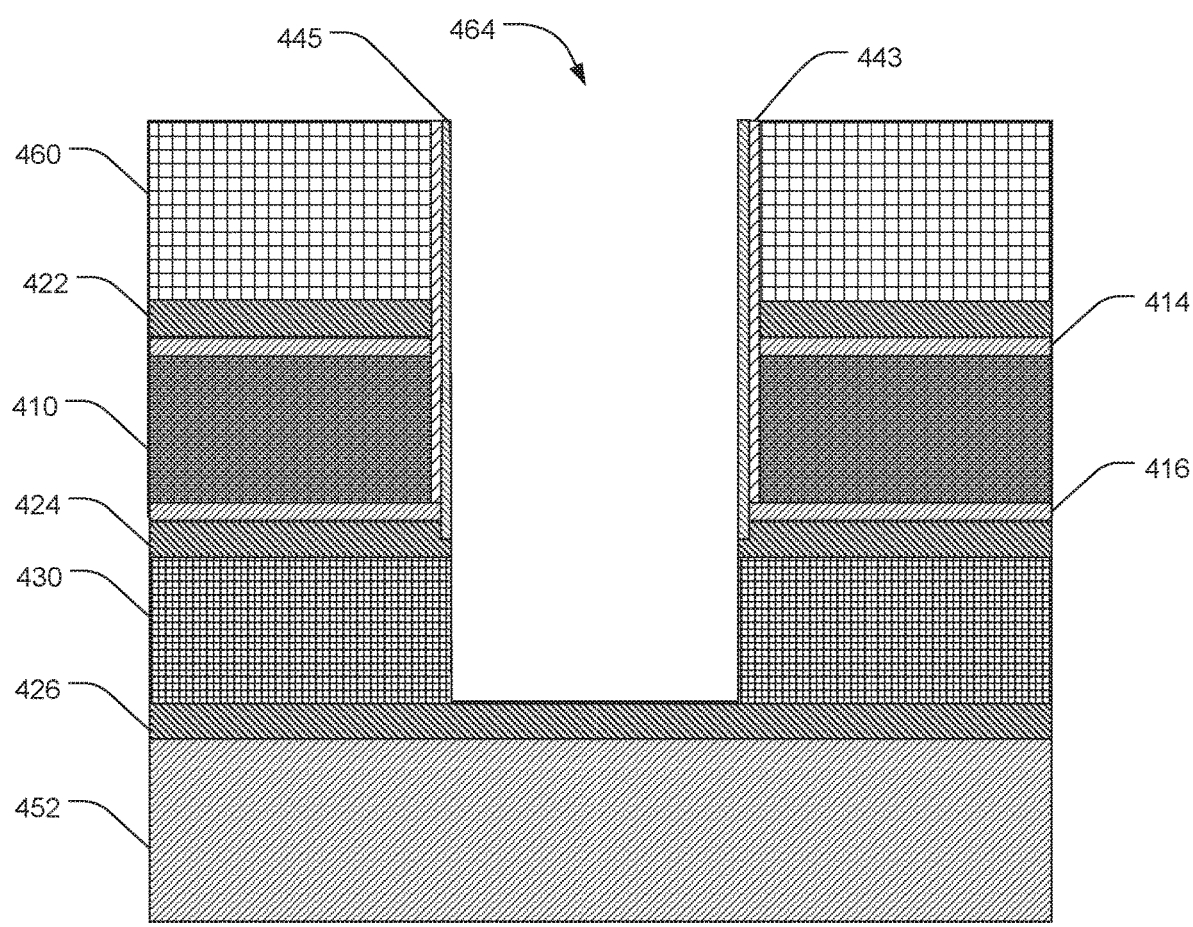
FIG. 4G illustrates a memory cell at one stage of manufacturing, in accordance with an example embodiment.

The second protective liner 445 can also maximize structural stability of the memory cell during extension of the first extended trench 463 through lower layers. As illustrated in FIG. 4G, the first extended trench 463 can be extended through the second protective liner 445, the remainder of the second electrode layer 424, and the SD layer 430 to form a second extended trench 464. As can be seen in FIG. 4G, the second protective liner 445 is largely removed during formation of the second extended trench 464. However, a portion of the second protective liner 445 can remain within the second extended trench 464. In some examples, the first protective liner 443 and the second protective liner 445 can comprise the same material(s). In other examples, the first protective liner 443 and the second protective liner 445 can comprise a different material or materials.

It is noted that residual phase change material can be deposited, trapped, or otherwise positioned between the first protective liner 443 and the second protective liner 445 during the manufacturing process. For example, in some cases, residual phase change material can be redeposited on the first protective liner 443 during a subsequent etch. In some examples, the first protective liner 443 can be distinguishable from the second protective liner 445 due to differences in material composition or the like. Where this is the case, residual phase change material can be identified on the first protective liner 443 (see FIG. 2B illustrating liner 240 having residual phase change material 211 trapped or deposited thereon, for example) at the boundary between the first protective liner 443 and the second protective liner 445. In other examples, the first protective liner 443 can be indistinguishable from the second protective liner 445 due to equivalent material selection, etc. Nonetheless, in some examples, residual phase change material can define a boundary (or partial boundary) between the first protective liner 443 and the second protective liner 445. Thus, in some examples, a boundary or partial boundary of the first protective liner 443 can be defined by residual phase change material trapped or deposited on the first protective liner 443 in an otherwise apparently contiguous dielectric material separating individual memory cells (see FIG. 1A, for example). The residual phase change material can be detected by transmission electron microscopy (TEM) or other suitable technique to identify the boundary of the first protective liner 443. In either case, residual phase change material can be identified in dielectric material formed along a lateral edge of individual memory cells. In some further examples, the residual phase change material can form a residual phase change layer positioned along a lateral edge of the PCM layer (or a portion thereof), the top lamina layer (or a portion thereof), a first electrode (or a portion thereof), or a combination thereof. In some further examples, the residual phase change material can be in direct contact with the PCM layer (or a portion thereof), the top lamina layer (or a portion thereof), a first electrode (or a portion thereof), or a combination thereof. In other examples, the residual phase change material can be spaced apart from the PCM layer (or a portion thereof), the top lamina layer (or a portion thereof), a first electrode (or a portion thereof), or a combination thereof with dielectric material positioned in between. In other examples, portions of the residual phase change material can be in direct contact with memory cell components and portions of the residual phase change material can be spaced apart from memory cell components.

Figure 4H:
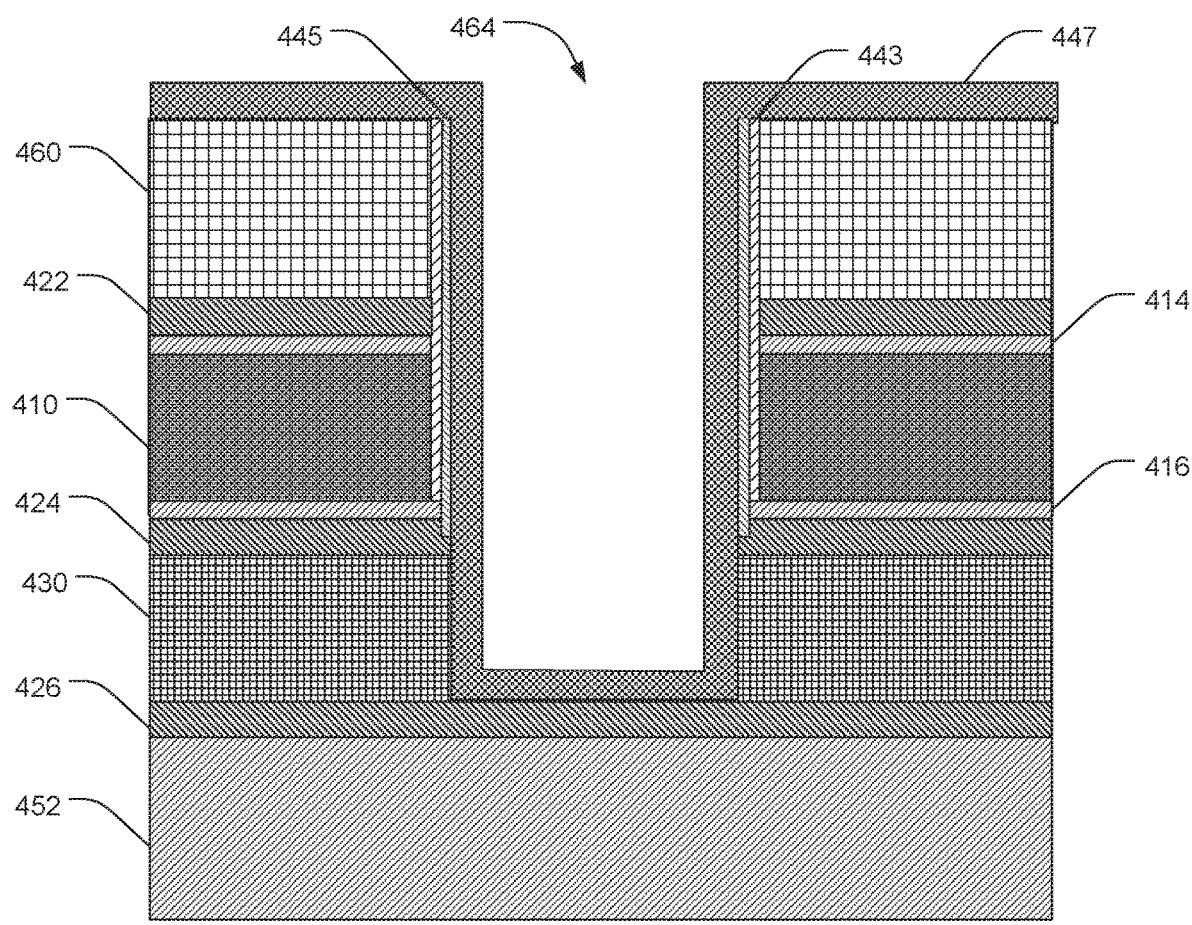
FIG. 4H illustrates a memory cell at one stage of manufacturing, in accordance with an example embodiment.

Turning to FIG. 4H, a third protective liner 447 can be formed along a perimeter of second extended trench 464 to protect upper layers during further extension of the trench 464. For example, as described above, the SD layer 430 can typically comprise a phase change material and can be subject to excessive material removal during extension of the trench 464 through the third electrode layer 426 and the lower conductive channel layer 452. Thus, the third protective liner 447 can help protect the SD layer 430 and other upper layers during further extension of the trench 464. Generally, any suitable dielectric material can be used for the third protective liner that is resistant to dry etching and/or wet etching and that has good conformability. In some specific examples, the third protective liner can be formed of a silicon oxide, a silicon nitride, a silicon oxynitride, other suitable protective material, or a combination thereof.

Figure 4I:
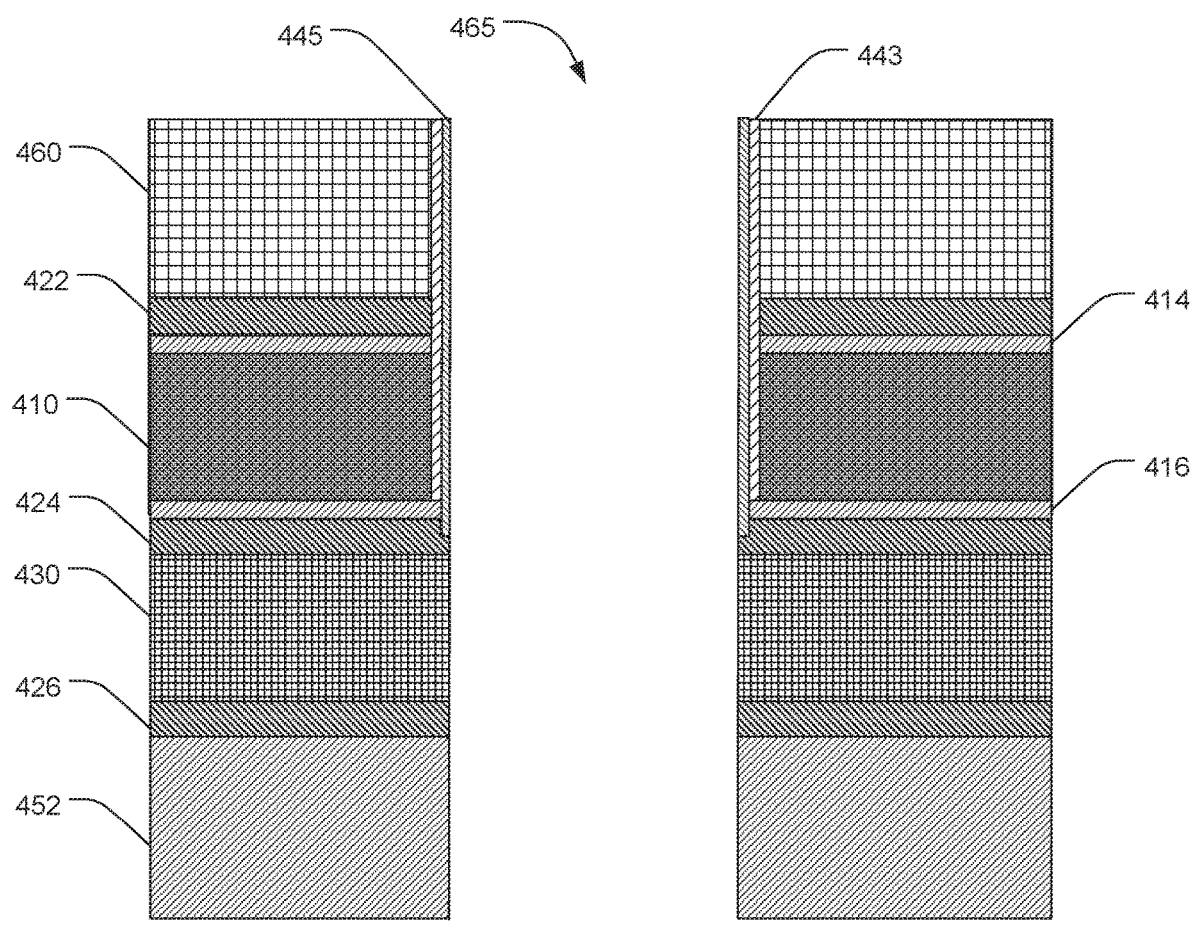
FIG. 4I illustrates a memory cell at one stage of manufacturing, in accordance with an example embodiment.
Figure 4J:
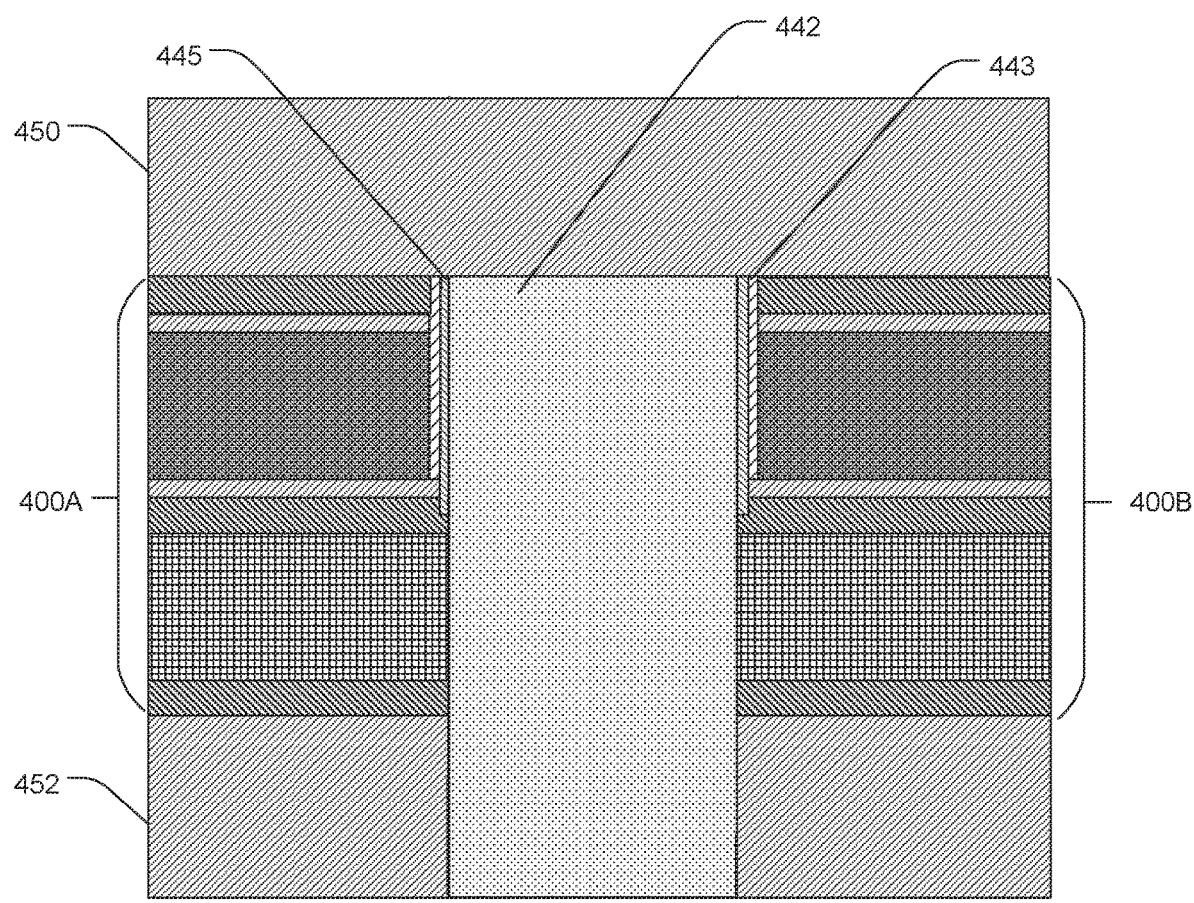
FIG. 4J illustrates a memory cell at one stage of manufacturing, in accordance with an example embodiment.

As illustrated in FIG. 4I, the third protective layer 447 can be largely or completely removed during formation of third extended trench 465. However, portions of first protective liner 443 and second protective liner 445 can remain in third extended trench 465. The third extended trench 465 can separate the preliminary stack (illustrated in FIG. 4A) into distinct stack segments including individual memory cells. As illustrated in FIG. 4J, the trench 465 can be filled in with dielectric material 442, the mask layer 460 can be removed, and an upper conductive channel 450 can be positioned across a row of individual memory cells 400A, 400B and intervening dielectric material 442 to form a memory device positioned between upper conductive channel 450 and lower conductive channels 452.

Of course, other material layers can be used to form individual memory cells. Any suitable material types are considered within the scope of the present disclosure unless otherwise specified. It is also noted that when discussing memory cells, memory devices, computing systems, and associated methods, per se, each individual discussion also applies to each of the other aspects of the present technology. Thus, for example, when discussing memory cells, per se, such discussion also applies to memory devices, computing systems, and associated methods, and vice versa.

EXAMPLES

In some examples, a memory cell includes a top lamina layer, a bottom lamina layer, and a phase change material (PCM) layer between the top lamina layer and the bottom lamina layer, the PCM layer having a top surface in direct contact with the top lamina layer and a bottom surface in direct contact with the bottom lamina layer, wherein the top surface of the PCM layer and the bottom surface of the PCM layer have a width ratio of from 0.8:1 to 1.05:1.

In some examples of a memory cell, the top lamina layer comprises tungsten, tantalum, titanium, a refractory metal nitride, a refractory metal silicide, a refractory metal carbide, a refractory metal boride, or a combination thereof.

In some examples of a memory cell, the bottom lamina layer comprises tungsten, tantalum, titanium, a refractory metal nitride, a refractory metal silicide, a refractory metal carbide, a refractory metal boride, or a combination thereof.

In some examples of a memory cell, the top lamina layer and the bottom lamina layer comprise the same material or combination of materials.

In some examples of a memory cell, the PCM layer comprises germanium, antimony, tellurium, silicon, nickel, gallium, arsenic, silver, tin, gold, lead, bismuth, indium, yttrium, selenium, scandium, boron, oxygen, sulphur, nitrogen, carbon, or a combination thereof.

In some examples of a memory cell, the PCM layer comprises antimony and tellurium.

In some examples of a memory cell, antimony and tellurium are present at a weight ratio (Sb/Te) of from 0.45 to 0.8.

In some examples of a memory cell, the top surface of the PCM layer and the bottom surface of the PCM layer have a width ratio of from 0.85:1 to 1.02:1.

In some examples of a memory cell, the top surface of the PCM layer and the top lamina layer have a width ratio of from 0.7:1 to 1.05:1.

In some examples of a memory cell, the bottom surface of the PCM layer and the bottom lamina layer have a width ratio of from 0.6:1 to 1.05:1.

In some examples of a memory cell, the PCM layer has a trapezoidal cross-section.

In some examples of a memory cell, a top lamina layer is wider than the top surface of the PCM layer forming an upper recess between a lateral edge of the top lamina layer and a lateral edge of the PCM layer at the top surface.

In some examples of a memory cell, the upper recess has a depth of less than 5 nanometers (nm).

In some examples of a memory cell, the bottom lamina layer is wider than the bottom surface of the PCM layer forming a lower recess between the lateral edge of the bottom lamina layer and a lateral edge of the PCM layer at the bottom surface.

In some examples of a memory cell, the lower recess has a depth of less than 10 nm.

In some examples of a memory cell, the memory cell can further include a first electrode layer disposed on the top lamina layer.

In some examples of a memory cell, the first electrode comprises amorphous carbon, carbon nitride, a refractory metal, a refractory metal nitride, a refractory metal silicide, a refractory metal carbide, a refractory metal boride, or a combination thereof.

In some examples of a memory cell, a bottom surface of the first electrode and the top lamina layer have a width ratio of from 0.8:1 to 1.2:1.

In some examples of a memory cell, the bottom lamina layer is disposed on a second electrode layer.

In some examples of a memory cell, the second electrode comprises amorphous carbon, carbon nitride, a refractory metal, a refractory metal nitride, a refractory metal silicide, a refractory metal carbide, a refractory metal boride, or a combination thereof.

In some examples of a memory cell, the second electrode layer is disposed on a select device layer.

In some examples of a memory cell, the select device layer comprises germanium, antimony, tellurium, silicon, nickel, gallium, arsenic, silver, tin, gold, lead, bismuth, indium, yttrium, selenium, scandium, boron, oxygen, sulphur, nitrogen, carbon, or a combination thereof.

In some examples of a memory cell, the select device layer is disposed on a third electrode layer.

In some examples of a memory cell, the third electrode layer comprises amorphous carbon, carbon nitride, a refractory metal, a refractory metal nitride, a refractory metal silicide, a refractory metal carbide, a refractory metal boride, or a combination thereof.

In some examples of a memory cell, the memory cell further includes a dielectric material positioned along a lateral edge of the top lamina layer, the bottom lamina layer, and the PCM layer, wherein residual phase change material is positioned within the dielectric material and not in direct contact with the PCM layer.

In some examples, another memory cell includes a top lamina layer, a bottom lamina layer, a phase change material (PCM) layer between the top lamina layer and the bottom lamina layer, the PCM layer having a top surface in direct contact with the top lamina layer and a bottom surface in direct contact with the bottom lamina layer, a dielectric material positioned along a lateral edge of the top lamina layer, the bottom lamina layer, and the PCM layer, and residual phase change material within the dielectric material and not in direct contact with the PCM layer.

In some examples of another memory cell, the top lamina layer comprises tungsten, tantalum, titanium, a refractory metal nitride, a refractory metal silicide, a refractory metal carbide, a refractory metal boride, or a combination thereof.

In some examples of another memory cell, the bottom lamina layer comprises tungsten, tantalum, titanium, a refractory metal nitride, a refractory metal silicide, a refractory metal carbide, a refractory metal boride, or a combination thereof.

In some examples of another memory cell, the top lamina layer and the bottom lamina layer comprise the same material or combination of materials.

In some examples of another memory cell, the PCM layer comprises germanium, antimony, tellurium, silicon, nickel, gallium, arsenic, silver, tin, gold, lead, bismuth, indium, yttrium, selenium, scandium, boron, oxygen, sulphur, nitrogen, carbon, or a combination thereof.

In some examples of another memory cell, the PCM layer comprises antimony and tellurium.

In some examples of another memory cell, antimony and tellurium are present at a weight ratio (Sb/Te) of from 0.45 to 0.8.

In some examples of another memory cell, the top surface of the PCM layer and the bottom surface of the PCM layer have a width ratio of from 0.8:1 to 1.05:1.

In some examples of another memory cell, the top surface of the PCM layer and the top lamina layer have a width ratio of from 0.7:1 to 1.05:1.

In some examples of another memory cell, the bottom surface of the PCM layer and the bottom lamina layer have a width ratio of from 0.6:1 to 1.05:1.

In some examples of another memory cell, the PCM layer has a trapezoidal cross-section.

In some examples of another memory cell, a top lamina layer is wider than the top surface of the PCM layer forming an upper recess between a lateral edge of the top lamina layer and a lateral edge of the PCM layer at the top surface.

In some examples of another memory cell, the upper recess has a depth of less than 5 nm.

In some examples of another memory cell, the bottom lamina layer is wider than the bottom surface of the PCM layer forming a lower recess between the lateral edge of the bottom lamina layer and a lateral edge of the PCM layer at the bottom surface.

In some examples of another memory cell, the lower recess has a depth of less than 10 nm.

In some examples of another memory cell, the dielectric material comprises a first protective liner in direct contact with the lateral edge of the top lamina layer, the bottom lamina layer, and the PCM layer.

In some examples of another memory cell, the memory cell further includes a first electrode layer disposed on the top lamina layer.

In some examples of another memory cell, the first electrode comprises amorphous carbon, carbon nitride, a refractory metal, a refractory metal nitride, a refractory metal silicide, a refractory metal carbide, a refractory metal boride, or a combination thereof.

In some examples of another memory cell, the bottom lamina layer is disposed on a second electrode layer.

In some examples of another memory cell, the second electrode comprises amorphous carbon, carbon nitride, a refractory metal, a refractory metal nitride, a refractory metal silicide, a refractory metal carbide, a refractory metal boride, or a combination thereof.

In some examples of another memory cell, the second electrode layer is disposed on a select device layer.

In some examples of another memory cell, the select device layer comprises germanium, antimony, tellurium, silicon, nickel, gallium, arsenic, silver, tin, gold, lead, bismuth, indium, yttrium, selenium, scandium, boron, oxygen, sulphur, nitrogen, carbon, or a combination thereof.

In some examples of another memory cell, the select device layer is disposed on a third electrode layer.

In some examples of another memory cell, the third electrode layer comprises amorphous carbon, carbon nitride, a refractory metal, a refractory metal nitride, a refractory metal silicide, a refractory metal carbide, a refractory metal boride, or a combination thereof.

In some examples, a memory device includes a plurality of upper conductive channels, a plurality of lower conductive channels, and an array of individually addressable memory cells organized in columns and rows between individual upper conductive channels and individual lower conductive channels, individual memory cells including a top lamina layer, a bottom lamina layer, and a phase change material (PCM) layer between the top lamina layer and the bottom lamina layer, the PCM layer having a top surface in direct contact with the top lamina layer and a bottom surface in direct contact with the bottom lamina layer, wherein the top surface of the PCM layer and the bottom surface of the PCM layer have a width ratio of from 0.8:1 to 1.05:1.

In some examples of a memory device, individual upper conductive channels comprise tungsten (W), tungsten nitride (WN), nickel (Ni), aluminum (Al), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In some examples of a memory device, individual lower conductive channels comprise tungsten (W), tungsten nitride (WN), nickel (Ni), aluminum (Al), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In some examples of a memory device, the plurality of upper conductive channels and the plurality of lower conductive channels comprise the same material or combination of materials.

In some examples of a memory device, the top lamina layer comprises tungsten, tantalum, titanium, a refractory metal nitride, a refractory metal silicide, a refractory metal carbide, a refractory metal boride, or a combination thereof.

In some examples of a memory device, the bottom lamina layer comprises tungsten, tantalum, titanium, a refractory metal nitride, a refractory metal silicide, a refractory metal carbide, a refractory metal boride, or a combination thereof.

In some examples of a memory device, the top lamina layer and the bottom lamina layer comprise the same material or combination of materials.

In some examples of a memory device, the PCM layer comprises germanium, antimony, tellurium, silicon, nickel, gallium, arsenic, silver, tin, gold, lead, bismuth, indium, yttrium, selenium, scandium, boron, oxygen, sulphur, nitrogen, carbon, or a combination thereof.

In some examples of a memory device, the PCM layer comprises antimony and tellurium.

In some examples of a memory device, antimony and tellurium are present at a weight ratio (Sb/Te) of from 0.45 to 0.8.

In some examples of a memory device, the top surface of the PCM layer and the bottom surface of the PCM layer have a width ratio of from 0.85:1 to 1.02:1.

In some examples of a memory device, the top surface of the PCM layer and the top lamina layer have a width ratio of from 0.7:1 to 1.05:1.

In some examples of a memory device, the bottom surface of the PCM layer and the bottom lamina layer have a width ratio of from 0.6:1 to 1.05:1.

In some examples of a memory device, the PCM layer has a trapezoidal cross-section.

In some examples of a memory device, a top lamina layer is wider than the top surface of the PCM layer forming an upper recess between a lateral edge of the top lamina layer and a lateral edge of the PCM layer at the top surface.

In some examples of a memory device, the upper recess has a depth of less than 5 nm.

In some examples of a memory device, the bottom lamina layer is wider than the bottom surface of the PCM layer forming a lower recess between the lateral edge of the bottom lamina layer and a lateral edge of the PCM layer at the bottom surface.

In some examples of a memory device, the lower recess has a depth of less than 10 nm.

In some examples of a memory device, the memory device further includes a first electrode layer disposed on the top lamina layer.

In some examples of a memory device, the first electrode comprises amorphous carbon, carbon nitride, a refractory metal, a refractory metal nitride, a refractory metal silicide, a refractory metal carbide, a refractory metal boride, or a combination thereof.

In some examples of a memory device, a bottom surface of the first electrode and the top lamina layer have a width ratio of from 0.8:1 to 1.2:1.

In some examples of a memory device, the bottom lamina layer is disposed on a second electrode layer.

In some examples of a memory device, the second electrode comprises amorphous carbon, carbon nitride, a refractory metal, a refractory metal nitride, a refractory metal silicide, a refractory metal carbide, a refractory metal boride, or a combination thereof.

In some examples of a memory device, the second electrode layer is disposed on a select device layer.

In some examples of a memory device, the select device layer comprises germanium, antimony, tellurium, silicon, nickel, gallium, arsenic, silver, tin, gold, lead, bismuth, indium, yttrium, selenium, scandium, boron, oxygen, sulphur, nitrogen, carbon, or a combination thereof.

In some examples of a memory device, the select device layer is disposed on a third electrode layer.

In some examples of a memory device, the third electrode layer comprises amorphous carbon, carbon nitride, a refractory metal, a refractory metal nitride, a refractory metal silicide, a refractory metal carbide, a refractory metal boride, or a combination thereof.

In some examples of a memory device, the memory device further includes a dielectric material positioned along a lateral edge of the top lamina layer, the bottom lamina layer, and the PCM layer, wherein residual phase change material is positioned within the dielectric material and not in direct contact with the PCM layer.

In some examples, a computing system includes a motherboard and a memory device as described herein operably coupled to the motherboard.

In some examples of a computing system, the computing system comprises a desktop computer, a laptop computer, a tablet, a smartphone, a wearable device, a server, or a combination thereof.

In some examples of a computing system, the computing system further comprises a processor, a memory device, a heat sink, a radio, a slot, a port, or a combination thereof operably coupled to the motherboard.

In some examples, a method of manufacturing a memory cell includes forming a phase change material (PCM) layer between a top lamina layer and a bottom lamina layer, forming a trench through the top lamina layer and the PCM layer, forming a first protective liner along a perimeter of the trench, extending the trench through the first protective liner and the bottom lamina layer, and filling in the trench with dielectric material.

In some examples of a method of manufacturing a memory cell, the first protective liner and the dielectric material comprise the same material or combination of materials.

In some examples of a method of manufacturing a memory cell, the first protective liner and the dielectric material comprise a different material or combination of materials.

In some examples of a method of manufacturing a memory cell, an upper surface of the PCM layer and a lower surface of the PCM layer have a width ratio of from 0.8:1 to 1.05:1 after extending the trench through the first protective liner and the bottom lamina layer.

In some examples of a method of manufacturing a memory cell, the method further includes forming a first electrode layer on the top lamina layer, wherein the trench is also formed through the first electrode layer.

In some examples of a method of manufacturing a memory cell, the method further includes forming a mask layer on the first electrode layer, wherein the trench is also formed through the mask layer.

In some examples of a method of manufacturing a memory cell, the method further includes forming the bottom lamina layer on a second electrode layer.

In some examples of a method of manufacturing a memory cell, the method further includes forming the second electrode layer on a select device layer.

In some examples of a method of manufacturing a memory cell, the method further includes forming the select device layer on a third electrode layer.

In some examples of a method of manufacturing a memory cell, the method further includes forming the third electrode layer on a lower conductive channel.

In some examples of a method of manufacturing a memory cell, the trench is further extended through a portion of the second electrode layer to form a first extended trench.

In some examples of a method of manufacturing a memory cell, the method further includes forming a second protective liner along a perimeter of the first extended trench.

In some examples of a method of manufacturing a memory cell, the method further includes extending the second extended trench through the second protective liner, the second electrode layer, and the select device layer to form a second extended trench.

In some examples of a method of manufacturing a memory cell, the method further includes forming a third protective liner along a perimeter of the second extended trench.

In some examples of a method of manufacturing a memory cell, the method further includes extending the second extended trench through the third protective liner, the third electrode, and the lower conductive channel.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A memory cell, comprising:
    a top lamina layer;
    a bottom lamina layer;
    a phase change material (PCM) layer between the top lamina layer and the bottom lamina layer, the PCM layer having a top surface in direct contact with the top lamina layer and a bottom surface in direct contact with the bottom lamina layer,
    wherein the top surface of the PCM layer and the bottom surface of the PCM layer have a width ratio of from 0.8:1 to 1.05:1, and wherein the top lamina layer and the bottom lamina layer are adhesion layers;
    a first electrode disposed on the top lamina layer;
    a second electrode disposed below the bottom lamina layer;
    a first dielectric liner extending along and in direct contact with a side surface of the top lamina layer and a contiguous side surface of the PMC layer, the first dielectric liner not extending beyond a top surface of the bottom lamina layer; and
    a second dielectric liner in direct contact with and extending along a side surface of the first dielectric liner, the second dielectric liner further extending beyond the side surface of the first liner in direct contact with and along a side surface of the bottom lamina layer.

2. The memory cell of claim 1, wherein the top lamina layer and the bottom lamina layer comprise substantially a same material or combination of materials, the material or combination of materials comprising at least one of tungsten, tantalum, titanium, a refractory metal nitride, a refractory metal silicide, a refractory metal carbide, or a refractory metal boride.

3. The memory cell of claim 1, wherein the top surface of the PCM layer and the bottom surface of the PCM layer have a width ratio of one of 0.85:1, 0.87:1, or 0.9:1 to 0.99:1.

4. The memory cell of claim 1, wherein the top surface of the PCM layer and the top lamina layer have a width ratio of from 0.7:1 to 1.05:1.

5. The memory cell of claim 1, wherein the bottom surface of the PCM layer and the bottom lamina layer have a width ratio of from 0.6:1 to 1.05:1.

6. The memory cell of claim 1, wherein the PCM layer has a substantially trapezoidal shaped cross-section.

7. The memory cell of claim 1, wherein the top lamina layer is wider than the top surface of the PCM layer forming an upper recess between a lateral edge of the top lamina layer and a lateral edge of the PCM layer at the top surface.

8. The memory cell of claim 7, wherein the upper recess has a depth of less than 5 nanometers (nm).

9. The memory cell of claim 1, wherein the bottom lamina layer is wider than the bottom surface of the PCM layer forming a lower recess between the lateral edge of the bottom lamina layer and a lateral edge of the PCM layer at the bottom surface.

10. The memory cell of claim 9, wherein the lower recess has a depth of less than 10 nm.

* * * * *